United States Patent [19]
Ikeda

[11] Patent Number: 5,309,293
[45] Date of Patent: May 3, 1994

[54] MAGNETIC RECORDING/REPRODUCING APPARATUS

[75] Inventor: Masahiro Ikeda, Shimosuwa, Japan

[73] Assignee: Sankyo Seiki Mfg. Co., Ltd., Nagano, Japan

[21] Appl. No.: 849,358

[22] Filed: Mar. 11, 1992

[30] Foreign Application Priority Data

Mar. 25, 1991 [JP] Japan ................... 3-060114

[51] Int. Cl.$^5$ .............................. G11B 5/09
[52] U.S. Cl. .......................... 360/51; 360/53
[58] Field of Search ............ 360/51, 53, 46, 61

[56] References Cited

U.S. PATENT DOCUMENTS 4,726,042  2/1988  Vance ................ 333/172

FOREIGN PATENT DOCUMENTS 0117263  1/1989  Japan .

Primary Examiner—Donald Hajec
Assistant Examiner—Jhihan Clark
Attorney, Agent, or Firm—McAulay Fisher Nissen Goldberg & Kiel

[57] ABSTRACT

A magnetic recording/reproducing apparatus for recording data on a medium, for checking the recorded data and for retrieving any of the recorded data comprises a data reproduction device for reading data from a medium includes a conversion device for converting the signals for the reproduced data from the data reproduction device into read data pulses, a variable frequency oscillator for producing read data and window data out of the read data pulses from the conversion device and a follow-up characteristics switch device for switching the follow-up characteristics of the variable frequency oscillator from a narrow range option suitable for data checking to a wide range option suitable for data reproduction. With such an arrangement, a high level of quality of recorded data can be maintained, a wide range of compatibility of recording media is ensured and the rate of issuing error messages due to ISVs that can interrupt the operation of the apparatus is reduced.

5 Claims, 3 Drawing Sheets

MAGNETIC RECORDING/REPRODUCING APPARATUS

BACKGROUND OF THE INVENTION

Field of the invention

This invention relates to a magnetic recording/reproducing apparatus using magnetic tapes or magnetic discs for data back-up applications.

b) Background Art

Magnetic recording/reproducing apparatuses capable of recording data that do not contain clock pulses on a recording medium such as a magnetic tape or a magnetic disc, checking the recorded data and retrieving selected data are already known. FIG. 6 shows the reproduction circuit of such an apparatus.

In a magnetic recording/reproducing apparatus of this type, data that d(i not contain clock pulses can be recorded on a recording medium by a magnetic head and any of the data stored in the medium can be reproduced by the head 1. The electric signals for the data reproduced by the magnetic head 1 then go through an amplifier and a reproduction circuit 2 having a filter and are converted into corresponding read data pulses by a read data generating circuit 3. A variable frequency oscillator 4 produces read data and window data out of the read data pulses received from the read data generating circuit 3. Formatter 5 is constituted by a host system comprising a computer and discriminates the positions of the read data by using the window data from the variable frequency oscillator 4 and determines if the data are normal.

Where a RAW (read after write) system is involved, after the magnetic medium is moved a given distance on the magnetic head to record data, the medium is moved back and caused to pass by the magnetic head for a second time to reproduce and check the recorded data. If an error is found, the above process of data recording and reproduction is repeated to eliminate the error.

Where a RWW (read while write) system is used, on the other hand, the magnetic medium is moved a given distance either on a magnetic head having two channels or on two magnetic heads so that the data recorded by one of the channels or the heads are reproduced immediately after the recording by the other channel or head for error checking. If any error is detected, the above process of data recording and reproduction is repeated to eliminate the error.

The follow-up characteristics of the variable frequency oscillator 4 and therefore the relationship between the level of external disturbances applied to the read data pulses from the read data generation circuit 3 and the gain of the circuit will be typically such as shown in FIG. 7. In the frequency range where external disturbances are high, the circuit remarkably loses its follow-up capability.

Any of the data stored in the magnetic medium of the above apparatus can be reproduced by the magnetic head 1 and the signals for the reproduced data are then transmitted by way of the reproduction circuit 2 to the read data generation circuit 3, where they are converted into corresponding read data pulses. The variable frequency oscillator 4 produces read data and window data out of the read data pulses from the read data generation circuit 3 and the formatter 5 discriminates the positions of the read data by using the window data from the variable frequency oscillator 4. The follow-up characteristics of the variable frequency oscillator 4 for data reproduction are invariable and are identical with those for data recording.

Japanese Patent Publication Sho 64-17263 discloses a magnetic recording/reproducing apparatus comprising a variable frequency oscillator having two different sets, of follow-up characteristics that allow the operation of error detection to be conducted only in a frequency range where errors are liable to occur during data reproduction. The purpose of this operation is to detect a deteriorated portion of a disk so that that portion may be avoided during recording. During normal read and write operations, however, the filtering quality of the variable frequency oscillator is not changed.

With a magnetic recording/reproducing apparatus as described above with respect to FIG. 6, however, if the formatter 5 determines that the recorded data do not contain any error even if an ISV (instantaneous speed variance) is detected near the upper limit of the follow-up frequency range of the variable frequency oscillator 4 during data recording, it can later reverse its judgment and determine that the data contain an error because the variable frequency oscillator 4 cannot follow-up the ISV when the data are reproduced sometime later. The drawback may be remedied by broadening the width of the follow-up frequency range of the variable frequency oscillator 4 but such a broadened follow-up range is inevitably accompanied by the problem of deterioration of recorded data over a wide frequency range that results in incompatible magnetic media and the loss of feasibility.

The follow-up characteristics of the variable frequency oscillator 4 can vary from supplier to supplier and also from apparatus to apparatus to adversely affect the compatibility of magnetic media, entailing frequent occurrences of errors of the type described above.

It is therefore a primary object of the present invention to provide a magnetic recording/reproducing apparatus which is free from the above problems and can significantly reduce the frequency of occurrence of errors due to ISVs during data reproduction so that the compatibility of magnetic media and the quality of recorded data can be remarkably improved.

SUMMARY OF THE INVENTION

According to the present invention, the above object of the invention is achieved by providing a magnetic recording/reproducing apparatus for recording data on a medium, for checking the recorded data and for retrieving any of the recorded data. The apparatus comprises data reproduction means for reading data from a medium, conversion means for converting the signals for the reproduced data from the data reproduction means into read data pulses, a variable frequency oscillator for producing read data and window data out of the read data pulses from the conversion means and follow-up characteristics switch means for switching the follow-up characteristics of the variable frequency oscillator from a narrow range option suitable for data checking to a wide range option suitable for data reproduction.

With a follow-up characteristics switch means of the variable frequency oscillator, the follow-up range of the variable frequency oscillator is switched from a wide range option suitable for data checking to a narrow range option suitable for data reproduction.

For a better understanding of the present invention, reference is made to the following description and accompanying drawings while the scope of the invention will be pointed out in the appended claims.

BRIEF DESCRIPTION OF THE INVENTION

DETAILED DESCRIPTION OF THE PREFERRED EMBODIMENTS

Figure 6:
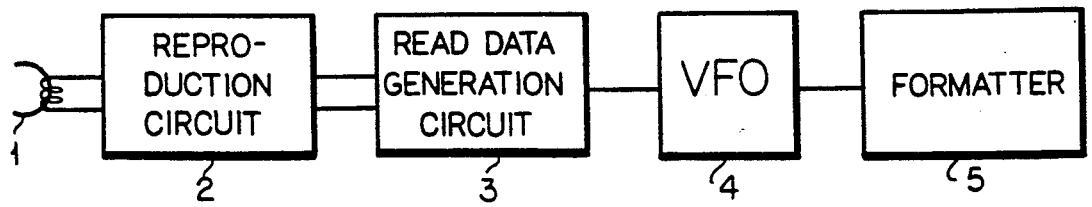
FIG. 6 is a block diagram showing the circuit configuration of the variable frequency oscillator of a conventional magnetic recording/reproducing apparatus.
Figure 7:
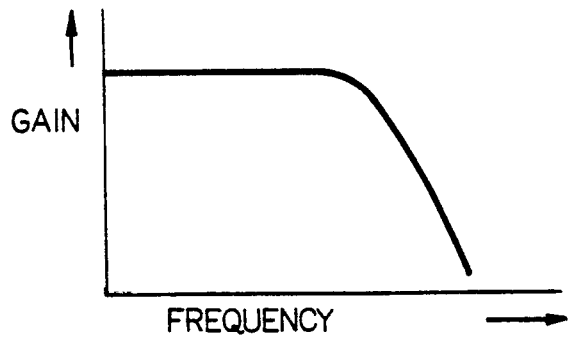
FIG. 7 is a graph showing the follow-up characteristics of FIG. 6.

The present invention differs from the above described known magnetic recording/reproducing apparatus comprising a variable frequency oscillator 4 as illustrated in FIG. 6 in that the variable frequency oscillator is replaced by a variable frequency oscillator 6 capable of selecting the follow-up characteristics and is provided with a lag type external time constant circuit (low pass filter) which is arranged at the output side of the charge pump of the variable frequency oscillator 6 and has a set of characteristics that are different from its counterpart of the conventional apparatus so that its follow-up characteristics can be switched from a narrow range option suitable for data checking to a wide range option suitable for data reproduction. The variable frequency oscillator 6 comprises a main body 6a and a time constant circuit (low pass filter) constituted by a resistor 6b and a pair of capacitors 6c, 6d arranged external to the main body at the output side of the charge pump of the main body 6a, of which the resistor 6b and the capacitors 6c, 6d are securely connected to the main body 6a. An analog switch 7 is provided as a switch means for selecting the follow-up characteristics of the variable frequency oscillator 6 and turned on/off according to a switch signal transmitted from an appropriate circuit (not shown).

Figure 1:
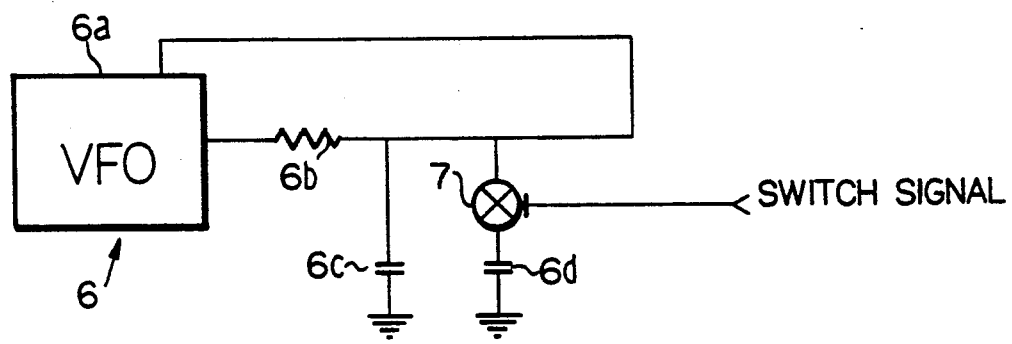
FIG. 1 is a circuit diagram of the variable frequency oscillator of a preferred embodiment of the invention.
Figure 2:
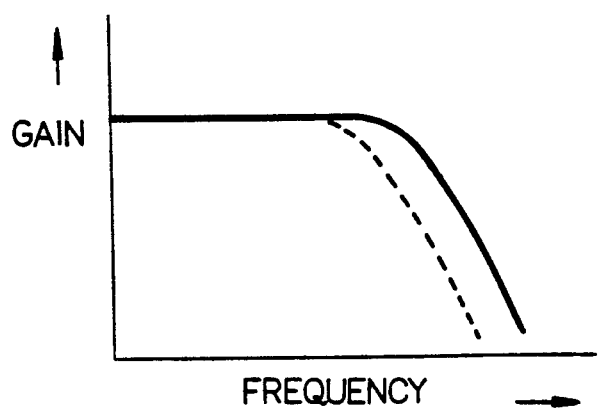
FIG. 2 is a graph showing the follow-up characteristics of the variable frequency oscillator of FIG. 1.

The analog switch 7 is turned on to connect the capacitors 6c and 6d in parallel when the apparatus is used for data recording and turned off to separate the capacitor 6d from the capacitor 6c when the apparatus is used for data reproduction. Consequently, the variable frequency oscillator 6 will show narrow follow-up characteristics for data recording as indicated by a solid line in FIG. 2 and will show wide follow-up characteristics as indicated by a broken line in FIG. 2 when data are reproduced by the apparatus.

Figure 3:
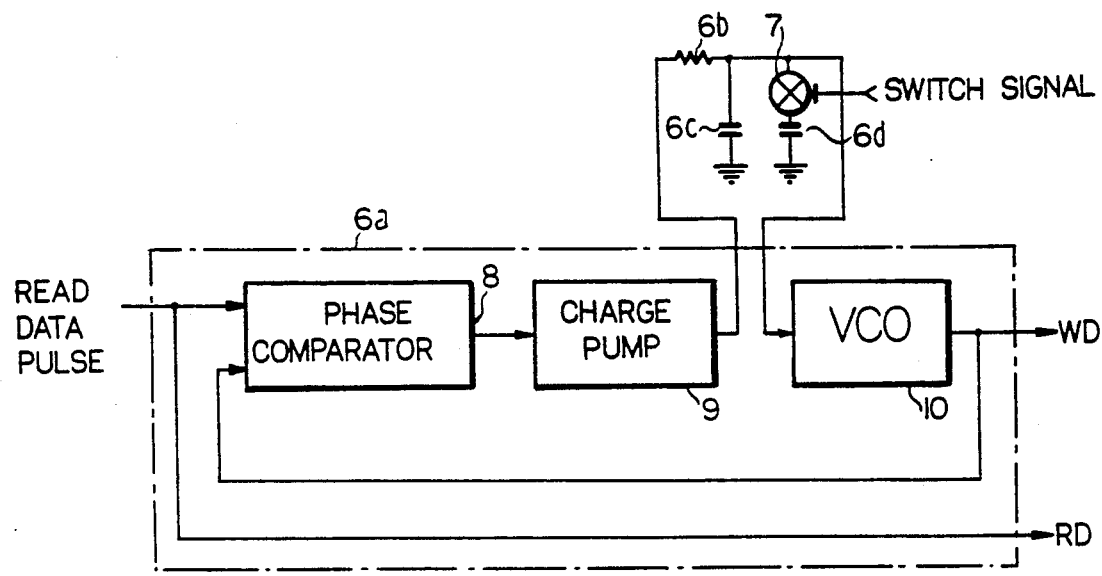
FIG. 3 is a block diagram showing the circuit configuration of the variable frequency oscillator of FIG. 1.

As illustrated in FIG. 3, the main body 6a of the variable frequency oscillator 6 comprises a phase comparator 8, a charge pump 9 and a voltage controlled oscillator (VCO) 10; an external time constant circuit comprising the elements 6b, 6c and 6d is fitted thereto. The phase of read data pulses transmitted from a read data generating circuit 3 is compared with that of corresponding window data coming from the VCO 10 for the phase and the result of comparison is given to the charge pump 9. The charge pump is charged with electricity as long as the read data pulses from the read data generating circuit 3 are more advanced than the corresponding window data from the VCO 10 in terms of phase and discharges its electric charge when the read data pulses from the read data generating circuit 3 are less advanced than the corresponding window data from the VCO 10 in terms of phase. The VCO 10 is controlled by the output signal voltage of the charge pump 9 for oscillation frequency and transmits its output signals to the formatter 5 as window data.

Figure 4:
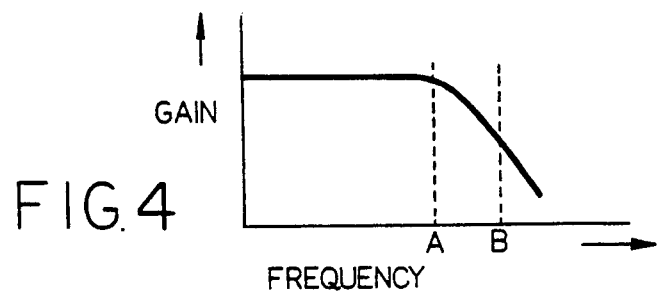
FIG. 4 is a graph showing the follow-up characteristics of the variable frequency oscillator of FIG. 1 during data recording.

The follow-up characteristics of the charge pump 9 and the filter section are determined by the external time constant circuit comprising the elements 6b, 6c, 6d. During data recording, the follow-up characteristics of the variable frequency oscillator 6 are narrowed as shown in FIG. 4 as the analog switch 7 is turned on to connect the capacitor 6d to the capacitor 6c in parallel so that the variable frequency oscillator 6 does not follow-up any ISVs that nay occur above the upper frequency limit A and the formatter 5 consequently judges the data there to contain errors. As a result, the apparatus operates to record the data that have been judged to contain errors for another time so that the recorded data may not contain any errors brought forth by noises due to external disturbances in the high frequency range. Therefore, the data is of such a high quality so that a wide range of compatibility of recording media is ensured.

Figure 5:
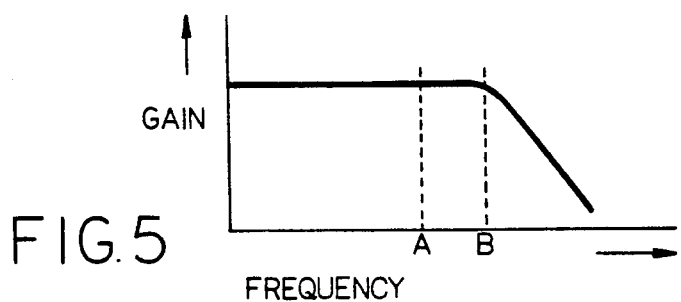
FIG. 5 is a graph showing the follow-up characteristics of the variable frequency oscillator of FIG. 1 during data reproduction.

During data reproduction, on the other hand, the follow-up characteristics of the variable frequency oscillator 6 are broadened as shown in FIG. 5 as the analog switch 7 is turned off to disconnect the capacitor 6d from the capacitor 6c so that the formatter 5 may not produce any judgment concerning errors if ISV's occur in the area above the upper frequency limit B because no data are recorded in that area. Thus, since no data are recorded in the area above the upper frequency limit B, the apparatus reproduces data from the medium without producing any error messages even through the data stored in the medium are of inferior quality. Consequently, the magnetic recording/reproducing apparatus can reproduce data over a wide range of frequency regardless of variances in the quality of the data stored in the medium and the follow-up characteristics of the apparatus involved without issuing any error messages.

The present invention is not limited to the above described embodiment and various modifications and alterations may be made thereto. Moreover, a magnetic recording/reproducing apparatus according to the invention may be used with a variety of media including photomagnetic recording media, magnetic cards, magnetic note books, floppy discs, hard discs for recording data, by checking the recorded data and by retrieving any of the stored data.

As is apparent from the above description, since a magnetic recording/reproducing apparatus for recording data on a medium, for checking the recorded data and for retrieving any of the recorded data according to the invention comprises data reproduction means for reading data from a medium, conversion means for converting the signals for the reproduced data from the data reproduction means into read data pulses, a variable frequency oscillator for producing read data and window data out of the read data pulses from the conversion means and follow-up characteristics switch means for switching the follow-up characteristics of the variable frequency oscillator from a narrow range option suitable for data checking to a wide range option suitable for data reproduction, it can maintain a high level of quality of recorded data, ensure a wide range of compatibility of recording media and reduce the rate of issuing error messages due to ISVs that can interrupt the operation of the apparatus.

While the foregoing description and drawings represent the preferred embodiments of the present invention, it will be obvious to those skilled in the art that various changes and modifications may be made therein without departing from the true spirit and scope of the present invention.

What is claimed is:

1. A magnetic recording/reproducing apparatus for recording data on a medium, for checking the recorded data and for retrieving any of the recorded data, said apparatus comprising:

data reproduction means for reading data from a medium;

conversion means for converting the signals for the reproduced data from said data reproduction means into read data pulses;

a variable frequency oscillator for producing read data and window data out of the read data pulses from said conversion means; and follow-up characteristics switch means for switching the follow-up characteristics of said variable frequency oscillator from a narrow range option suitable for data checking to a wide range option suitable for data reproduction;

whereby a high level of quality of recorded data can be maintained, a wide range of compatability of recording media is ensured and the rate of issuing error signals due to instantaneous speed variances is reduced.

2. The magnetic recording/reproducing apparatus of claim 1 wherein said variable frequency oscillator includes a time constant circuit, said time constant circuit for changing the follow-up characteristics of said variable frequency oscillator upon action of said follow-up characteristics switch means.

3. The magnetic recording/reproducing apparatus of claim 1 wherein said time constant circuit includes two parallel capacitors when the apparatus is used for data recording, one of said capacitors being disconnected by said follow-up characteristics switch means when the apparatus is being used for data reproduction.

4. The magnetic recording/reproducing apparatus of claim 2 wherein said variable frequency oscillator also includes a phase comparator responsive to read data pulses, a charge pump responsive to said phase comparator and a voltage controlled oscillator for providing said window data; said time constant circuit connected between said charge pump and said voltage controlled oscillator, so that the phase of read data pulses is compared with corresponding window data by the phase comparator, the result being provided to said charge pump.

5. In a magnetic recording/reproducing apparatus for recording data on a medium, for checking the recorded data and for retrieving any of the recorded data, said apparatus having data reproduction means, conversion means responsive to said data reproduction means for providing read data pulses, a variable frequency oscillator for providing read data and window data and a formatter responsive to said read data and window data, the improvement comprising:

means for selectably changing the follow-up characteristics of said variable frequency oscillator from a narrow frequency range suitable for data checking to a wide frequency range suitable for data reproduction so that a high level of quality of recorded data can be maintained, a wide range of compatability of recording media is ensured and the rate of issuing error signals due to instantaneous speed variances is reduced.

* * * * *